United States Patent [19]
New

[11] Patent Number: 6,046,603
[45] Date of Patent: Apr. 4, 2000

[54] METHOD AND APPARATUS FOR CONTROLLING THE PARTIAL RECONFIGURATION OF A FIELD PROGRAMMABLE GATE ARRAY

[75] Inventor: Bernard J. New, Los Gatos, Calif.

[73] Assignee: Xilinx, Inc., San Jose, Calif.

[21] Appl. No.: 08/989,980

[22] Filed: Dec. 12, 1997

[51] Int. Cl.[7] ...................... H03K 19/177; H03K 19/173
[52] U.S. Cl. ................................ 326/38; 326/40; 326/41; 326/47
[58] Field of Search ................................... 326/38–41, 47

[56] References Cited

U.S. PATENT DOCUMENTS

| | | | |
|---|---|---|---|
| Re. 34,363 | 8/1993 | Freeman | 307/465 |
| 5,144,166 | 9/1992 | Camarota et al. | 326/41 |
| 5,473,267 | 12/1995 | Stansfield | 326/41 |
| 5,488,582 | 1/1996 | Camarota | 365/189.05 |
| 5,600,263 | 2/1997 | Trimberger et al. | 326/39 |

OTHER PUBLICATIONS

"The Programmable Logic Data Book", (1996), available from Xilinx, Inc., 2100 Logic Drive, San Jose, California 95124, pp. 4–21 through 4–23.

"The Programmable Logic Data Book", (1994), available from Xilinx, Inc., 2100 Logic Drive, San Jose, California 95124, pp. 2–20 though 2–21.

*Primary Examiner*—Michael Tokar
*Assistant Examiner*—James H. Cho
*Attorney, Agent, or Firm*—E. Eric Hoffman; Jeanette S. Harms

[57] ABSTRACT

A field programmable gate array (FPGA) having an array of configurable logic blocks (CLBs) which can be partially reconfigured. Each column of CLBs is connected to a corresponding column select line, and each row of CLBs is connected to a corresponding row select line. A rectangular set of CLBs to be reconfigured is selected, wherein the rectangular set of CLBs is defined by the intersection of one or more consecutive columns of CLBs and one or more consecutive rows of CLBs. Column select signals are asserted on the column select lines associated with the one or more consecutive columns of CLBs. Similarly, row select signals are asserted on the row select lines associated with the one or more consecutive rows of CLBs. CLBs which receive both an asserted column select signal and an asserted row select signal are enabled for reconfiguration.

19 Claims, 8 Drawing Sheets

6,046,603

METHOD AND APPARATUS FOR CONTROLLING THE PARTIAL RECONFIGURATION OF A FIELD PROGRAMMABLE GATE ARRAY

BACKGROUND OF THE INVENTION

1. Field of the Invention

The present invention relates to the dynamic reconfiguration of a field programmable gate array (FPGA) during normal operating conditions of the FPGA. More specifically, the present invention relates to the dynamic reconfiguration of selected configuration logic blocks (CLBs) within an FPGA.

2. RELATED ART

FPGAs typically include a plurality of configurable logic blocks (CLBs), a programmable interconnect structure and a plurality of input/output blocks (IOBs). As described in U.S. Pat. No. 5,600,263, a cache memory can be used to store reconfiguration data values for configuring the CLBs. The reconfiguration data values stored in the cache memory corresponds to one or more CLB configurations in addition to the active configuration. As a result, all CLBs can be reconfigured concurrently from the reconfiguration data stored in local memory.

Each CLB is self-contained for the purposes of configuration. Reconfiguration of a selected subset of the CLBs of the FPGA (partial reconfiguration) would therefore require the identification of which CLBs are to be reconfigured, and which are not. One method of selecting CLBs during partial reconfiguration would involve the step of assigning each CLB a unique address. At reconfiguration time, a multi-bit address is broadcast to all of the CLBs, and each CLB reconfigures only if its stored address matches the broadcast address. Implementing comparison logic in each CLB is expensive, as is broadcasting a multi-bit address to all of the CLBs.

An alternative method for enabling partial reconfiguration of an FPGA would involve the step of individually and sequentially setting a control bit in each of the CLBs to be reconfigured. However, if many CLBs are to be reconfigured, the sequential setting of control bits can consume an excessive amount of time.

It would therefore be desirable to have an FPGA which can be partially reconfigured in an efficient manner, both in terms of speed and required overhead circuitry.

SUMMARY OF THE INVENTION

Accordingly, the present invention provides a method for partially reconfiguring an array of configurable logic blocks (CLBs) arranged in a plurality of rows and columns. In accordance with one embodiment, this method includes the steps of (1) connecting each column of CLBs to a corresponding column select line, (2) connecting each row of CLBs to a corresponding row select line, (3) selecting a rectangular set of CLBs to be reconfigured, wherein the rectangular set of CLBs is defined by the intersection of one or more consecutive columns of CLBs and one or more consecutive rows of CLBs, (4) asserting column select signals on the column select lines associated with the one or more consecutive columns of CLBs, (5) asserting row select signals on the row select lines associated with the one or more consecutive rows of CLBs, and (6) enabling reconfiguration circuits within each CLB which receives both an asserted column select signal and an asserted row select signal.

In a particular embodiment, the column select signals are asserted by asserting a first column select signal on a first column select line, propagating the first column select signal to one or more consecutive column select lines, and generating a control signal for stopping the propagation of the first column select signal. Similarly, the row select signals can be asserted by asserting a first row select signal on a first row select line, propagating the first row select signal to one or more consecutive row select lines, and generating a control signal for stopping the propagation of the first row select signal.

Another method in accordance with the invention includes the steps of: (1) selecting a block of CLBs within the array of CLBs for reconfiguration, the block of CLBs being defined by one or more consecutive rows beginning with a first row and ending with a second row, and one or more consecutive columns beginning with a first column and ending with a second column, (2) addressing the first row to generate a row select signal which is asserted at the first row and propagates toward the second row, (3) addressing the first column to generate a column select signal which is asserted at the first column and propagates toward the second column, (4) addressing the row immediately following the second row, thereby stopping the propagation of the row select signal at the second row, (5) addressing the column immediately following the second column, thereby stopping the propagation of the column select signal at the second column, and (6) reconfiguring each CLB which receives both the column select signal and the row select signal.

The present invention also includes a field programmable gate array (FPGA) which includes an array of configurable logic blocks (CLBs) arranged in a plurality of rows and columns. Each of the CLBs includes a reconfiguration circuit for reconfiguring the CLB, and an enabling circuit for enabling the reconfiguration circuit. A column select line is coupled to each of the enabling circuits in a corresponding column of CLBs. A row select line is coupled to each of the enabling circuits in a corresponding row of CLBs. A column select circuit is coupled to each of the column select lines, wherein the column select circuit is controlled to assert column select signals on one or more consecutive column select lines. A row select circuit is coupled to each of the row select lines, wherein the row select circuit is controlled to assert row select signals on one or more consecutive row select lines. Each of the enabling circuits which receives both a column select signal and a row select signal enables a corresponding one of the reconfiguration circuits. The row and column select circuits can include a plurality of cascaded exclusive OR gates or multiplexers.

The column select circuit can be located along a first edge of the FPGA and the row select circuit can be located along a second edge of the FPGA which is adjacent to the first edge. Alternatively, the column select circuit can be located along a first axis which extends through the array of CLBs, and the row select circuit can be located along a second axis which extends through the array of CLBs, perpendicular to the first axis.

The present invention will be more fully understood in view of the following description and drawings.

DETAILED DESCRIPTION

Figure 1:
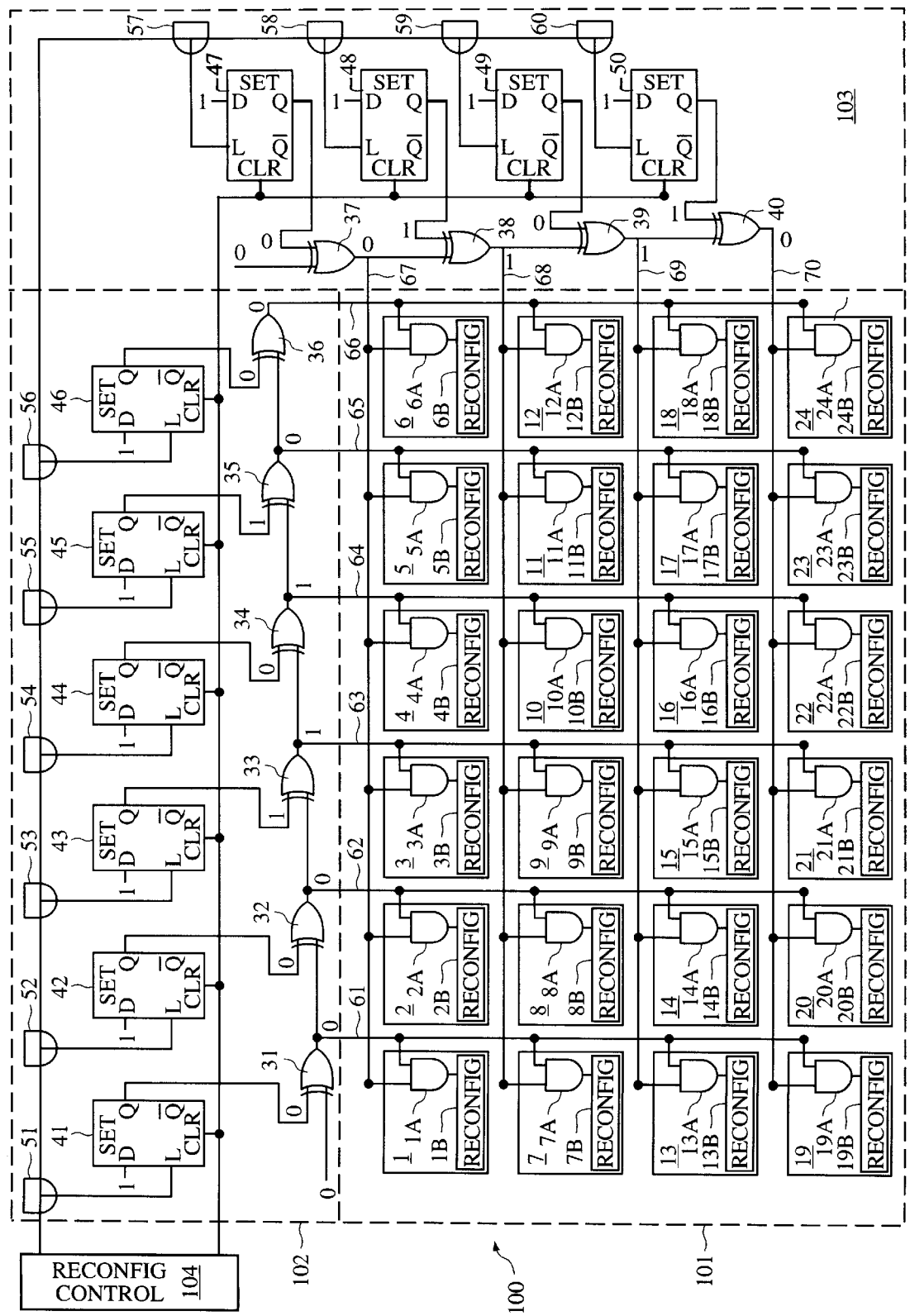
FIG. 1 is a schematic diagram of a portion of an FPGA in accordance with one embodiment of the present invention.

FIG. 1 is a schematic diagram of a portion of an FPGA 100 in accordance with one embodiment of the present invention. The illustrated portion of FPGA 100 includes CLB array 101, column select circuit 102, row select circuit 103 and reconfiguration control circuit 104. FPGA 100 also includes conventional programmable interconnect circuitry and IOBs, which are not shown in FIG. 1 for purposes of clarity.

CLB array 101 includes CLBs 1–24, which are arranged in four horizontal rows and six vertical columns. Although a 4×6 CLB array is illustrated and described, it is understood that CLB arrays having other dimensions are possible and are considered to fall within the scope of the invention. Conventional FPGAs typically have significantly larger CLB arrays. A general case can be defined where N is equal to the number of rows and M is equal to the number of columns of the CLB array. (In the described embodiment, N is equal to four and M is equal to six.)

Each of CLBs 1–24 includes an associated AND gate 1A–24A and an associated reconfiguration circuit 1B–24B. Each of the AND gates 1A–24A is coupled to an associated reconfiguration circuit 1B–24B within the associated CLB. These AND gates 1A–24A provide either a logic '0' signal or a logic '1' signal to the associated reconfiguration circuits 1B–24B. A logic '0' signal disables reconfiguration circuits 1B–24B, while a logic '1' signal enables reconfiguration circuits 1B–24B. The reconfiguration circuits 1B–24B include local cache memory blocks and are described in more detail in commonly owned, co-filed U.S. patent application Ser. No. 08/989,746, entitled "Rapidly Reconfigurable FPGA Having A Multiple Region Architecture with Reconfiguration Caches Usable As Data", by Bernard J. New, Robert Anders Johnson, Ralph Wittig and Sundararajarao Mohan, and in commonly owned co-filed U.S. patent application Ser. No. 08/990,154, entitled "Partially Reconfigurable FPGA and Method of Operating Same", by Bernard J. New and Charles R. Erickson, both of which are hereby incorporated by reference.

Figure 6:
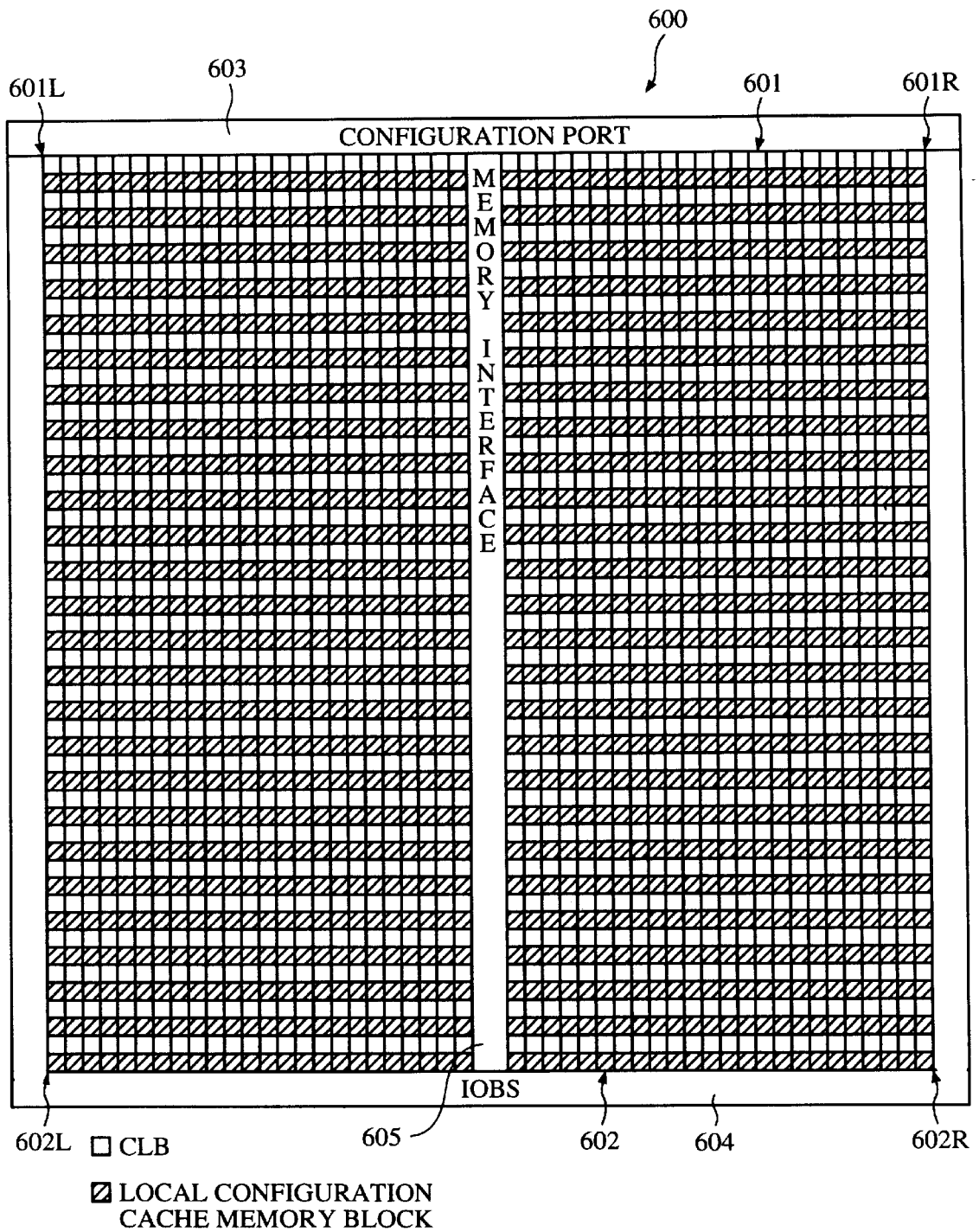
FIG. 6 is a block diagram of an FPGA in accordance with another embodiment of the present invention

FIG. 6 is a block diagram which illustrates the layout of the CLB arrays and the associated configuration memory of an FPGA 600. Of this embodiment, FPGA 600 includes a CLB array 601, a configuration cache memory array 602, a configuration port 603, a region of IOBs 604, and a memory interface circuit 605. CLB array 601 is partitioned into a left half-array 601L which is made up of 24 rows and 24 columns of CLBs, and a right half-array 601R which is also made up of 24 rows and 24 columns of CLBs. Configuration cache memory array 602 is partitioned into a left half-array 602L which is made up of 24 rows and 24 columns of local configuration cache memory blocks, and a right half-array 602R which is also made up of 24 rows and 24 columns of local configuration cache memory blocks. The 24 rows of CLB array 601 are interleaved with the 24 rows of configuration cache memory array 602 as illustrated in FIG. 6.

In this embodiment, each of the CLBs in CLB array 601 has a corresponding local configuration cache memory block in configuration cache memory array 602. Thus, each local configuration cache memory block has the capacity to store configuration data values and state data values for various configurations of the corresponding CLB.

A single column select line extends beside each column of CLB array 101. Thus, six column select lines 61–66 extend beside the six columns of CLB array 101 as illustrated. Similarly, a single row select line extends beside each row of CLB array 101. Thus, four row select lines 67–70 extend beside the four rows of CLB array 101. Each of the column select lines 61–66 is coupled to the AND gates in an associated column of CLB array 101. For example, column select line 61 is coupled to an input terminal of each of AND gates 1A, 7A, 13A and 19A in the first column of CLB array 101. Table 1 sets forth the complete connections between column select lines 61–66 and the AND gates 1A–24A.

TABLE 1

| Column Select Line | Coupled to AND gates |
| --- | --- |
| 61 | 1A, 7A, 13A, 19A |
| 62 | 2A, 8A, 14A, 20A |
| 63 | 3A, 9A, 15A, 21A |
| 64 | 4A, 10A, 16A, 22A |
| 65 | 5A, 11A, 17A, 23A |
| 66 | 6A, 12A, 18A, 24A |

Each of the row select lines 67–70 is coupled to the AND gates in an associated row of CLB array 101. Thus, row select line 67 is coupled to an input terminal of each of AND gates 1A–6A of the first row of CLB array 101. Similarly, row select line 68 is coupled to an input terminal of each of AND gates 7A–12A of the second row of CLB array 101. Row select line 69 is coupled to an input terminal of each of AND gates 13A–18A of the third row of CLB array 101. Finally, row select line 70 is coupled to an input terminal of each of AND gates 19A–24A of the fourth row of CLB array 101.

In the foregoing manner each of the AND gates 1A–24A is uniquely coupled to one of the column select lines 61–66 and one of the row select lines 67–70. As described in more detail below column select circuit 102 is controlled to assert logic '1' values on a consecutive set of the column select lines 61–67, and row select circuit 103 is controlled to assert logic '1' values on a consecutive set of the row select lines 68–70. Each of the AND gates 1A–24A which receives two logic '1' values will enable a reconfiguration circuit in the associated CLB. Those AND gates 1A–24A which do not receive two logic '1' values will fail to enable a reconfiguration circuit in the associated CLB.

Column select circuit 102 includes exclusive OR gates 31–36, flip-flops 41–46 and address decoders 51–56. The output terminals of exclusive OR gates 31–36 are connected to column select lines 61–66, respectively. The first input terminals of exclusive OR gates 31–36 are coupled to the Q output terminals of flip-flops 41–46, respectively. The second input terminal of exclusive OR gate 31 is coupled to receive a logic '0' signal. The second input terminals of exclusive OR gates 32, 33, 34, 35 and 36 are coupled to the output terminals of exclusive OR gates 31, 32, 33, 34 and 35, respectively, in a simple cascade configuration.

The D input terminal of each of flip-flops 41–46 is coupled to receive a logic '1' signal. The CLEAR input terminal of each of flip-flops 41–46 is coupled to receive a CLEAR signal. The LOAD input terminals of flip flops 41–46 are coupled to the output terminals of address decoders 51–56, respectively. Each of address decoders 51–56, in turn, is coupled to receive an ADDRESS signal. Each of address decoders 51–56 is associated with a column select line 61–66 and has a unique address. When the ADDRESS signal corresponds with the unique address of one of the address decoders 51–56, that address decoder asserts a logic '1' signal at its output terminal.

Similarly, row select circuit 103 includes exclusive OR gates 37–40, flip-flops 47–50 and address decoders 57–60. The output terminals of exclusive OR gates 37–40 are connected to row select lines 67–70, respectively. The first input terminals of exclusive OR gates 37–40 are coupled to the Q output terminals of flip-flops 47–50, respectively. The second input terminal of exclusive OR gate 37 is coupled to receive a logic '0' signal. The second input terminals of exclusive OR gates 38, 39 and 40 are coupled to the output terminals of exclusive OR gates 37, 38 and 39, respectively, in a simple cascade configuration.

The D input terminal of each of flip-flops 47–50 is coupled to receive a logic '1' signal. The CLEAR input terminal of each of flip-flops 47–50 is coupled to receive the same CLEAR signal as flip-flops 41–47. The LOAD input terminals of flip flops 47–50 are coupled to the output terminals of address decoders 57–60, respectively. Each of address decoders 57–60, in turn, is coupled to receive the same ADDRESS signal as address decoders 51–56. Address decoders 57–60 operate in the same manner as address decoders 51–56. The previously described portion of FPGA 100 operates as follows to enable partial reconfiguration. First, a predetermined rectangular group of CLBs is selected for reconfiguration. The following example will assume that the rectangular group of CLBs which includes CLBs 9, 10, 15 and 16 is selected for reconfiguration. The other CLBs 1–8, 11–14 and 17–24 are not to be reconfigured in this example.

After the rectangular group has been selected, reconfiguration control circuit 104 asserts the CLEAR signal, thereby clearing flip-flops 41–50. The reconfiguration control circuit 104 then asserts a first ADDRESS signal which is provided to address decoders 51–60. The first ADDRESS signal is selected to correspond with the address decoder associated with the first column of the rectangular group of CLBs. Thus, in the present example, the first ADDRESS signal is selected to correspond with address decoder 53. Upon receiving the first ADDRESS signal, address decoder 53 asserts a logic '1' signal, thereby causing a logic '1' signal to be loaded into flip flop 43 and provided at the Q output terminal of flip flop 43.

The reconfiguration control circuit then asserts a second ADDRESS signal. The second ADDRESS signal is selected to correspond with the address decoder associated with the column immediately after the last column of the determined rectangular group of CLBs. Thus, in the present example, the second address signal is selected to correspond with address decoder 55. Upon receiving the second ADDRESS signal, address decoder 55 asserts a logic '1' signal, thereby causing a logic '1' signal to be loaded into flip flop 45 and provided at the Q output terminal of flip flop 45.

Providing logic '1' signals at the Q output terminals of flip flops 43 and 45 (and logic '0' signals at the Q output terminals of flip flops 41, 42, 44 and 46) results in logic '1' values being provided on column select lines 63–64, and logic '0' values being provided on column select lines 61–62 and 65–66. The first ADDRESS signal effectively defines the first column select line to be asserted at a logic '1' level, and the second ADDRESS signal effectively defines the column select line immediately after the last column select line to be asserted at a logic '1' level.

Reconfiguration control circuit 104 further asserts a third ADDRESS signal. The third ADDRESS signal is selected to correspond with the address decoder associated with the first row of the rectangular group of CLBs. Thus, in the present example, the third ADDRESS signal is selected to correspond with address decoder 58. Upon receiving the third ADDRESS signal, address decoder 58 asserts a logic '1' signal, thereby causing a logic '1' signal to be loaded into flip flop 48 and provided at the Q output terminal of flip flop 48.

Reconfiguration control circuit 104 further asserts a fourth ADDRESS signal. The fourth ADDRESS signal is selected to correspond with the address decoder associated with the row immediately after the last row of the determined rectangular group of CLBs. Thus, in the present example, the fourth ADDRESS signal is selected to correspond with address decoder 60. Upon receiving the fourth ADDRESS signal, address decoder 60 asserts a logic '1' signal, thereby causing a logic '1' signal to be loaded into flip flop 50 and provided at the Q output terminal of flip flop 50.

Providing logic '1' signals at the Q output terminals of flip flops 48 and 50 (and logic '0' signals at the Q output terminals of flip flops 47 and 49) results in logic '1' values being provided on row select lines 68–69, and logic '0' values being provided on row select lines 67 and 70. The third ADDRESS signal effectively defines the first row select line to be asserted at a logic '1' level, and the fourth ADDRESS signal effectively defines the row after the last row select line to be asserted at a logic '1' level.

By providing logic '1' signals on column select lines 63–64 and row select lines 68–69, the input terminals of AND gates 9A, 10A, 15A and 16A are provided with logic '1' signals. As a result, the reconfiguration circuits 9B, 10B, 15B and 16B within CLBs 9, 10, 15 and 16 are selectively enabled. Using the previously defined techniques, any rectangular set of CLBs 1–24 can be selected for reconfiguration in response to the four ADDRESS signals. Note that the second ADDRESS signal is given an invalid value to select column select line 66. Similarly, the fourth ADDRESS signal is given an invalid value to select row select line 70.

Figure 2A:
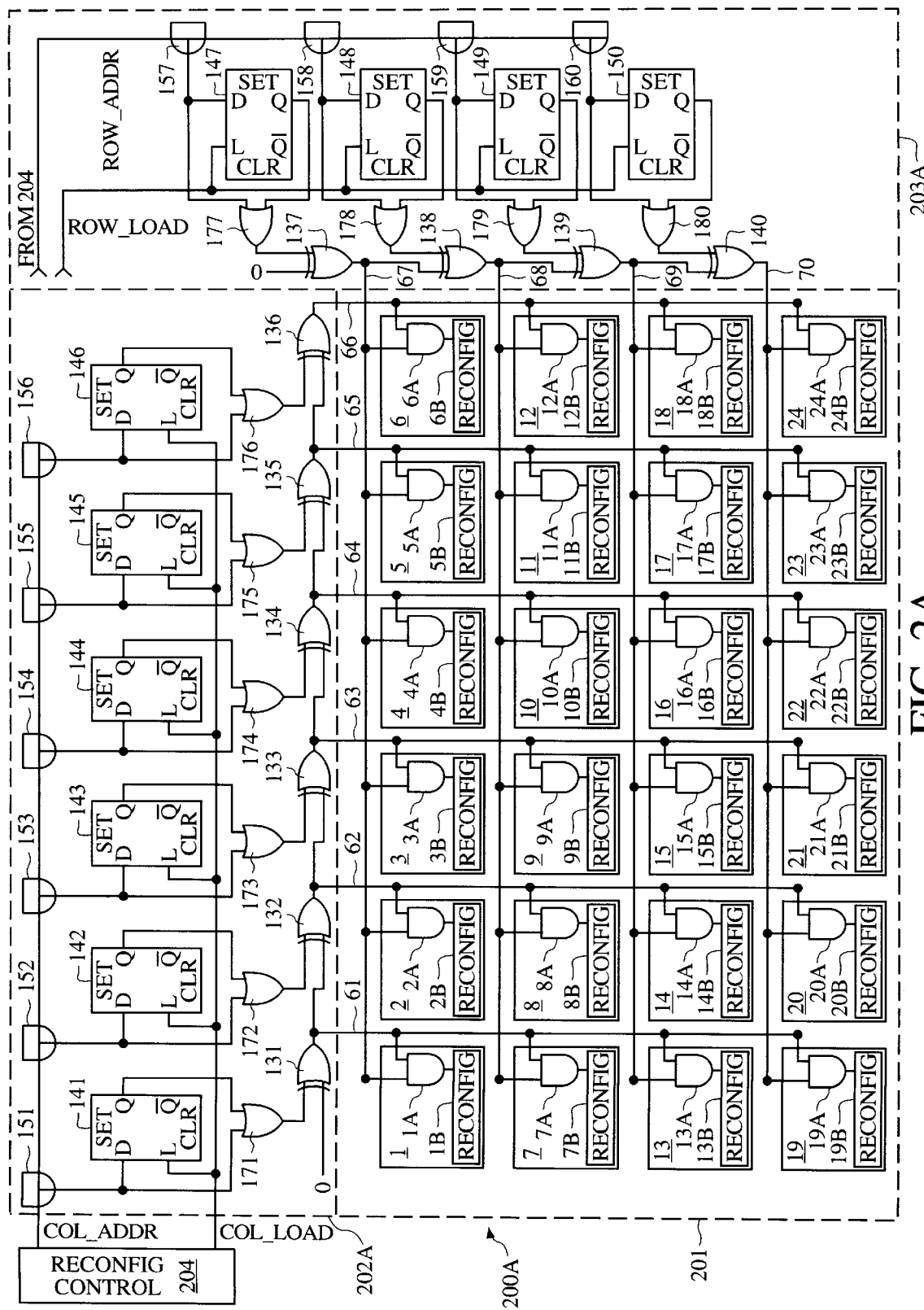
FIG. 2A is a schematic diagram of a portion of an FPGA in accordance with another embodiment of the present invention.

FIG. 2A is a schematic diagram of a portion of an FPGA 200A in accordance with another embodiment of the present invention. The illustrated portion of FPGA 200A includes CLB array 201, column select circuit 202A, row select circuit 203A and reconfiguration control circuit 204. FPGA 200A also includes conventional programmable interconnect circuitry and IOBs, which are not shown in FIG. 2A for purposes of clarity.

CLB array 201 is identical to previously described CLB array 101 (FIG. 1). Thus, similar elements in CLB arrays 101 and 201 are labeled with similar reference numbers. Column select circuit 202A and row select circuit 203A operate in the manner described below to select any rectangular set of CLBs for reconfiguration.

Column select circuit 202A includes exclusive OR gates 131–136, D-Q flip flops 141–146, address decoders 151–156 and OR gates 171–176. The output terminals of exclusive OR gates 131–136 are connected to column select lines 61–66, respectively. The first input terminals of exclusive OR gates 131–136 are coupled to the output terminals of OR gates 171–176, respectively. The second input terminal of exclusive OR gate 131 is coupled to receive a logic '0' signal. The second input terminals of exclusive OR gates 132, 133, 134, 135 and 136 are coupled to the output terminals of exclusive OR gates 131, 132, 133, 134 and 135, respectively, in a simple cascade configuration.

The D input terminals of flip-flops 141–146 and the first input terminals of OR gates 171–172 are coupled to address decoders 151–156, respectively. The second input terminals of OR gates 171–176 are coupled to the Q output terminals of flip flops 141–146, respectively. The LOAD input terminals of flip flops 141–146 are coupled to receive a COL__LOAD signal from reconfiguration control circuit 204. Each of address decoders 151–156 is coupled to receive a COL__ADDRESS signal from reconfiguration control circuit 204. Address decoders 151–156 operate in the same manner as address decoders 51–56 (FIG. 1).

Row select circuit 203A includes exclusive OR gates 137–140, D-Q flip flops 147–150, address decoders 157–160 and OR gates 177–180. The output terminals of exclusive OR gates 137–140 are connected to row select lines 67–70, respectively. The first input terminals of exclusive OR gates 137–140 are coupled to the output terminals of OR gates 177–180, respectively. The second input terminal of exclusive OR gate 137 is coupled to receive a logic '0' signal. The second input terminals of exclusive OR gates 138, 139 and 140 are coupled to the output terminals of exclusive OR gates 137, 138 and 139, respectively, in a simple cascade configuration.

The D input terminals of flip-flops 147–150 and the first input terminals of OR gates 177–180 are coupled to the output terminals of address decoders 157–160, respectively. The second input terminals of OR gates 177–180 are coupled to the Q output terminals of flip flops 147–150, respectively. The LOAD input terminals of flip flops 147–150 are coupled to receive a ROW__LOAD signal from reconfiguration control circuit 204. Each of address decoders 157–160 is coupled to receive a ROW__ADDRESS signal from reconfiguration control circuit 204. Address decoders 157–160 operate in the same manner as address decoders 57–60 (FIG. 1).

The previously described portion of FPGA 200A operates as follows to enable partial reconfiguration. First, a predetermined rectangular group of CLBs is selected for reconfiguration. The following example will assume that the rectangular group of CLBs which includes CLBs 2, 3, 4, 5, 8, 9, 10 and 11 is selected for reconfiguration. The other CLBs 1, 6, 7, 12 and 13–24 are not to be reconfigured in this example.

After the rectangular group has been selected, reconfiguration control circuit 204 asserts a CLEAR signal to the CLEAR input terminals of flip-flops 141–150, thereby clearing flip-flops 141–150 (the connections between reconfiguration control circuit 204 and the CLEAR input terminals of flip-flops 141–150 are not shown in FIG. 2A for purposes of clarity). The reconfiguration control circuit 204 then asserts a first COL__ADDRESS signal which is provided to address decoders 151–156. The first COL__ADDRESS signal is selected to correspond with the address decoder associated with the first column of the rectangular group of CLBs. Thus, in the present example, the first COL__ADDRESS signal is selected to correspond with address decoder 152. Upon receiving the first COL__ADDRESS signal, address decoder 152 asserts a logic '1' signal. At this time, the reconfiguration control circuit 204 asserts the COL__LOAD signal, thereby causing this logic '1' signal to be loaded into flip flop 142 and provided at the Q output terminal of flip flop 142.

The reconfiguration control circuit 204 then de-asserts the COL__LOAD signal and asserts a second COL__ADDRESS signal. The second COL__ADDRESS signal is selected to correspond with the address decoder associated with the column immediately after the last column of the determined rectangular group of CLBs. Thus, in the present example, the second COL__ADDRESS signal is selected to correspond with address decoder 156. Upon receiving the second COL__ADDRESS signal, address decoder 156 asserts a logic '1' signal. The second COL__ADDRESS signal remains asserted for the duration of the partial reconfiguration.

The logic '1' signal provided at the Q output terminal of lip flop 142 causes OR gate 172 to provide a logic '1' output signal to exclusive OR gate 132. Similarly, the logic '1' signal provided by address decoder 156 causes OR gate 176 to provide a logic '1' signal to exclusive OR gate 136. OR gates 171 and 173–175 provide logic '0' signals to exclusive OR gates 131 and 133–135, respectively. As a result, exclusive OR gates 132–135 provide logic '1' signals on column select lines 62–65, respectively. Exclusive OR gates 131 and 136 provide logic '0' signals on column select lines 61 and 66, respectively. The first COL__ADDRESS signal effectively defines the first column select line to be asserted at a logic '1' level, and the second COL__ADDRESS signal effectively defines the column select line immediately after the last column select line to be asserted at a logic '1' level.

Row select circuit 203A is operated substantially in parallel with the column select circuit 202A as follows. The reconfiguration control circuit 204 asserts a first ROW__ADDRESS signal which is provided to address decoders 157–160. The first ROW__ADDRESS signal is selected to correspond with the address decoder associated with the first row of the rectangular group of CLBs. Thus, in the present example, the first ROW__ADDRESS signal is selected to correspond with address decoder 157. Upon receiving the first ROW__ADDRESS signal, address decoder 157 asserts a logic '1' signal. At this time, the reconfiguration control circuit 204 asserts the ROW__LOAD signal, thereby causing this logic '1' signal to be loaded into flip flop 147 and provided at the Q output terminal of flip flop 147.

The reconfiguration control circuit 204 then de-asserts the ROW__LOAD signal and asserts a second ROW__ADDRESS signal. The second ROW__ADDRESS signal is selected to correspond with the address decoder associated with the row immediately after the last row of the determined rectangular group of CLBs. Thus, in the present example, the second ROW__ADDRESS signal is selected to correspond with address decoder 159. Upon receiving the second ROW__ADDRESS signal, address decoder 159 asserts a logic '1' signal. The second ROW__ADDRESS signal remains asserted for the duration of the partial reconfiguration.

The logic '1' signal provided at the Q output terminal of flip flop 147 causes OR gate 177 to provide a logic '1' output signal to exclusive OR gate 137. Similarly, the logic '1' signal provided by address decoder 159 causes OR gate 179 to provide a logic '1' signal to exclusive OR gate 139. OR gates 178 and 180 provide logic '0' signals to exclusive OR gates 138 and 140, respectively. As a result, exclusive OR gates 137 and 138 provide logic '1' signals on row select lines 67–68, respectively. Exclusive OR gates 139 and 140 provide logic '0' signals on row select lines 69 and 70, respectively. In the foregoing manner, the first ROW_ADDRESS signal effectively defines the first row select line to be asserted at a logic '1' level, and the second ROW_ADDRESS signal effectively defines the row select line immediately after the last row select line to be asserted at a logic '1' level.

By asserting logic '1' signals on column select lines 62–65 and row select lines 67–68, the input terminals of AND gates 2A, 3A, 4A, 5A, 6A, 8A, 9A, 10A and 11A are provided with logic '1' signals. As a result, the reconfiguration circuits 2B–5B and 8B–11B within CLBs 2–5 and 8–11 are selectively enabled. Using the previously defined techniques, column select circuit 202A and row select circuit 203A can be used to select any rectangular set of CLBs 1–24 for reconfiguration. Note that to enable the last column select line 66, a second COL_ADDRESS signal having an invalid value is provided by reconfiguration control circuit 204. Similarly, to enable the last row select line 70, a second ROW_ADDRESS signal is given an invalid value by reconfiguration control circuit 204.

Figure 2B:
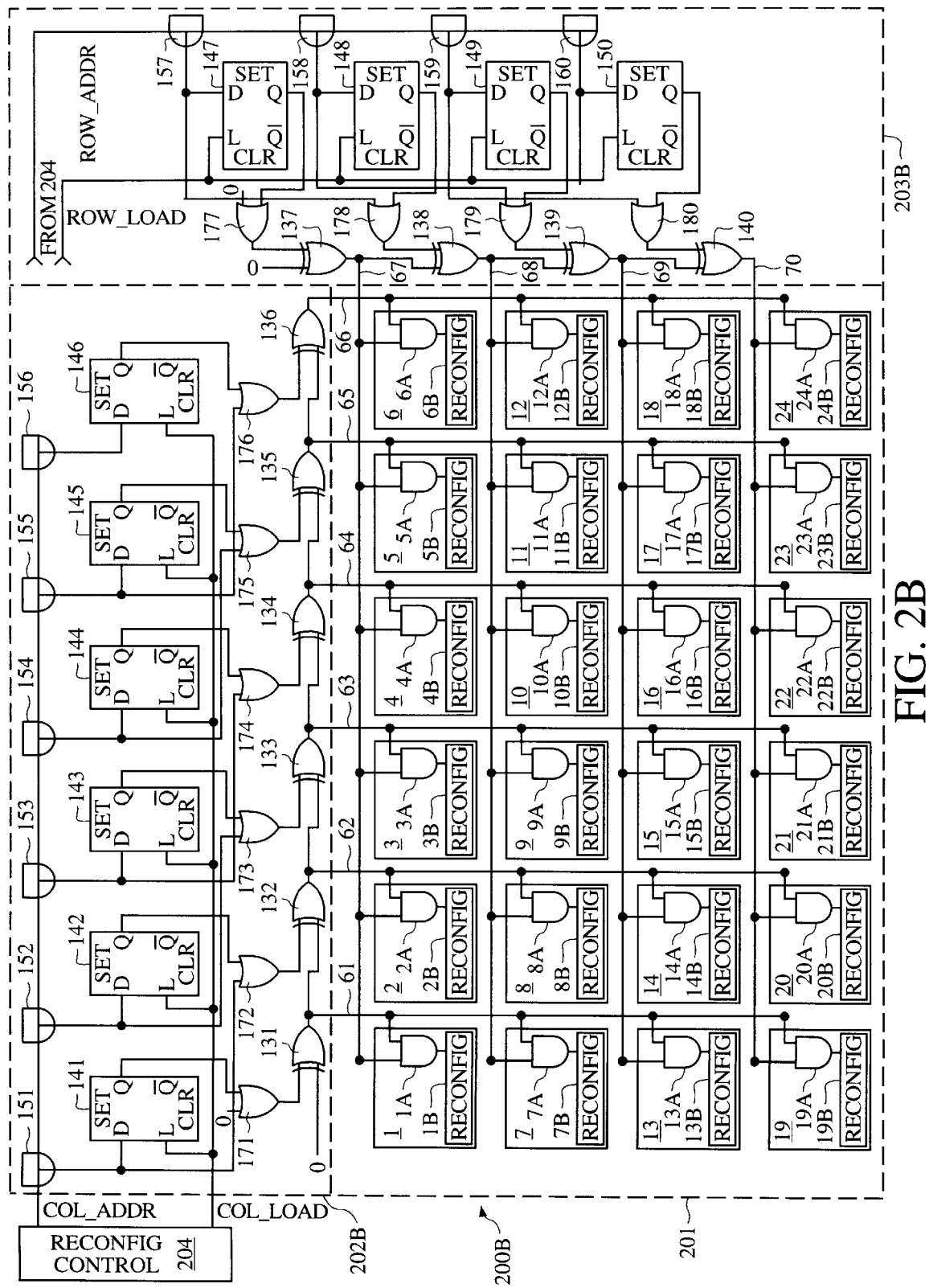
FIG. 2B is a schematic diagram of a portion of an FPGA which is a variation of the FPGA of FIG. 2A.

FIG. 2B is a schematic diagram of a portion of an FPGA 200B in accordance with one variation of the present invention. Many of the elements of FPGA 200B are similar to the previously described elements of FPGA 200A (FIG. 2A). Thus, similar elements in FIGS. 2A and 2B are labeled with similar reference numbers. The main difference between FPGA 200A and FPGA 200B are the connections between address decoders 151–156 and OR gates 171–176 in column select circuit 202B, and the connections between address decoders 157–160 and OR gates 177–180 in row select circuit 203B. In FPGA 200B, the first input terminal of OR gate 171 is connected to receive a logic 0 value. The first input terminals of OR gates 172, 173, 174, 175 and 176 are connected to the output terminals of address decoders 151, 152, 153, 154 and 155, respectively. Similarly, the first input terminal of OR gate 177 is connected to receive a logic 0 value. The first input terminals of OR gates 178, 179 and 180 are connected to the output terminals of address decoders 157, 158, and 159, respectively. Thus, each of the address decoder circuits 151–155 and 157–159 is connected to the OR gate immediately right of (or below) the OR gate to which the address decoder circuit was connected in FIG. 2A.

FPGA 200B operates in a manner similar to that previously described for FPGA 200A. That is, a rectangular group of CLBs to be reconfigured is selected. After the rectangular group has been selected, reconfiguration control circuit 204 asserts a CLEAR signal to the CLEAR input terminals of flip-flops 141–150, thereby clearing flip-flops 141–150. The reconfiguration control circuit 204 then asserts a first COL_ADDRESS signal which is provided to address decoders 151–156. The first COL_ADDRESS signal is selected to correspond with the address decoder associated with the first column of the rectangular group of CLBs. Upon receiving the first COL_ADDRESS signal, the corresponding address decoder asserts a logic '1' signal. At this time, the reconfiguration control circuit 204 asserts the COL_LOAD signal, thereby causing this logic '1' signal to be loaded into the flip flop associated with the address decoder and provided at the Q output terminal of this flip flop.

The reconfiguration control circuit 204 then de-asserts the COL_LOAD signal and asserts a second COL_ADDRESS signal. The second COL_ADDRESS signal is selected to correspond with the address decoder associated with the last column of the determined rectangular group of CLBs. Upon receiving the second COL_ADDRESS signal, the corresponding address decoder asserts a logic '1' signal. The second COL_ADDRESS signal remains asserted for the duration of the partial reconfiguration.

The first COL_ADDRESS signal effectively defines the first column select line to be asserted at a logic '1' level, and the second COL_ADDRESS signal effectively defines the last column select line to be asserted at a logic '1' level. The row select circuit is operated in a similar manner to select the desired rows for reconfiguration.

In the foregoing manner, column select circuit 202B selects the desired columns for reconfiguration by addressing the first and last columns to be reconfigured (rather than the first column and the column after the last column). Similarly, row select circuit 203B selects the desired rows for reconfiguration by addressing the first and last rows to be reconfigured (rather than the first row and the row after the last row).

Figure 3A:
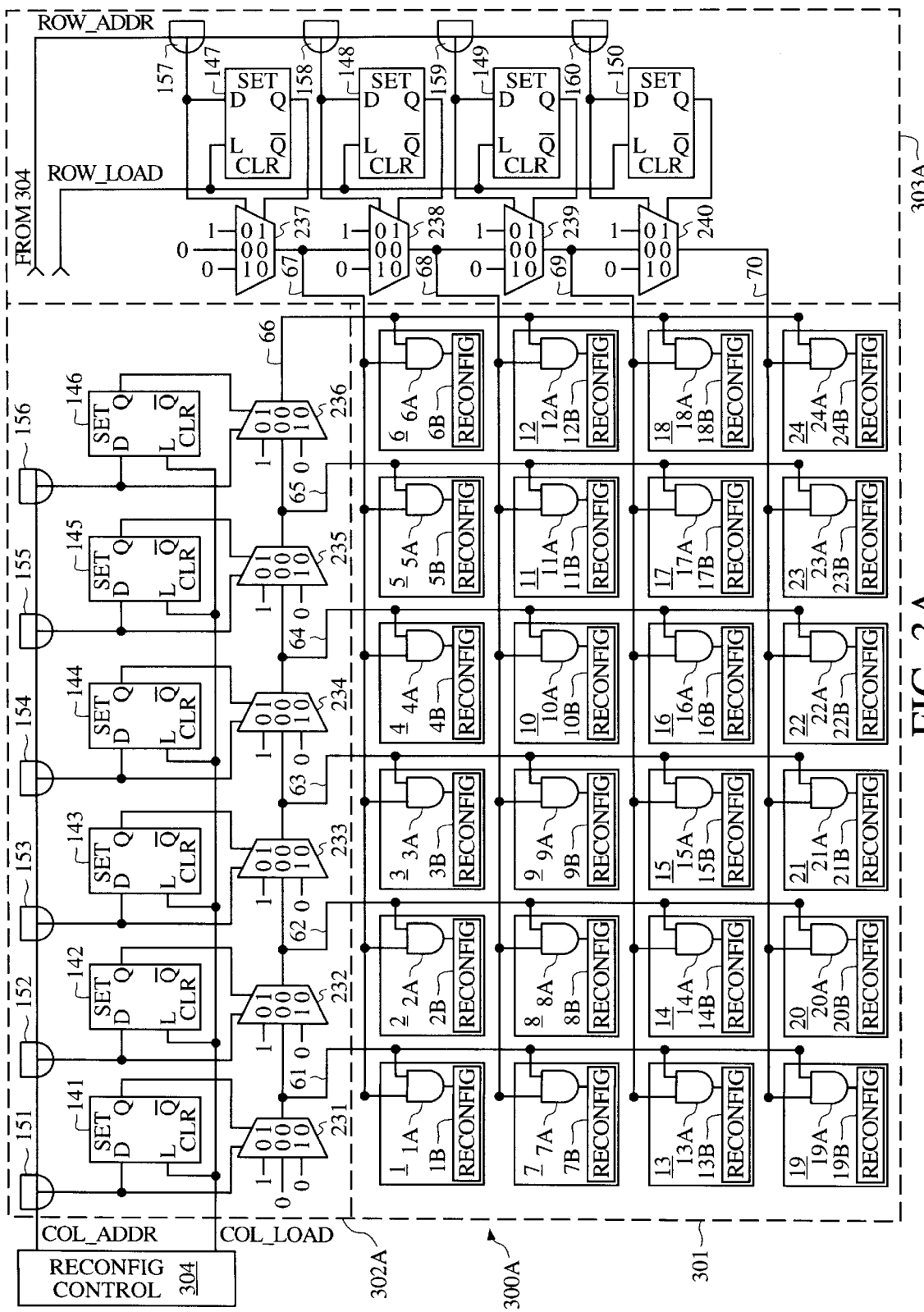
FIG. 3A is a schematic diagram of a portion of an FPGA in accordance with yet another embodiment of the present invention.

FIG. 3A is a schematic diagram of a portion of an FPGA 300 in accordance with another embodiment of the present invention. The illustrated portion of FPGA 300A includes CLB array 301, column select circuit 302A, row select circuit 303A and reconfiguration control circuit 304. FPGA 300A also includes conventional programmable interconnect circuitry and IOBs, which are not shown in FIG. 3A for purposes of clarity.

CLB array 301 is identical to previously described CLB array 101 (FIG. 1). Thus, similar elements in CLB arrays 101 and 301 are labeled with similar reference numbers. Column select circuit 302A and row select circuit 303A operate in the manner described below to select any rectangular set of CLBs for reconfiguration.

Column select circuit 302A is similar to column select circuit 202A (FIG. 2A). Thus, column select circuit 302A includes D-Q flip flops 141–146 and address decoders 151–156. However, exclusive OR gates 131–136 and OR gates 171–176 of column select circuit 202A are replaced with 3-to-1 multiplexers 231–236 in column select circuit 302A.

Similarly, row select circuit 303A is similar to row select circuit 203A (FIG. 2A). Thus, row select circuit 303A includes D-Q flip flops 147–150 and address decoders 157–160. However, exclusive OR gates 137–140 and OR gates 177–180 of row select circuit 203A are replaced with 3-to-1 multiplexers 237–240 in row select circuit 303A.

Multiplexers 231–240 are connected as follows. The output terminals of multiplexers 231–236 are connected to column select lines 61–66, respectively. The output terminals of multiplexers 237–240 are connected to row select lines 67–70. The first input terminals of multiplexers 231–240 are connected to receive logic '1' signals. The second input terminals of multiplexer 231 is connected to receive a logic '1' signal. The second input terminals of multiplexers 232–240 are connected to the output terminals of multiplexers 231–239, respectively. The third input terminals of multiplexers 231–240 are connected to receive logic '0' signals.

The first control terminals of multiplexers 231–240 are connected to the output terminals of address decoders 151–160, respectively. The second control terminals of multiplexers 231–240 are connected to the Q output terminals of flip flops 141–150, respectively. Each of multiplexers 231–240 routes a signal from one of the three input terminals to the output terminal in response to the signals provided on the first and second control terminals. Table 2 summarizes the operating characteristics of multiplexers 231–240.

TABLE 2

| SIGNAL ON FIRST CONTROL TERMINAL | SIGNAL ON SECOND CONTROL TERMINAL | INPUT SIGNAL PROVIDED TO OUTPUT TERMINAL |
|---|---|---|
| 0 | 1 | FIRST INPUT SIGNAL (i.e., '1') |
| 0 | 0 | SECOND INPUT SIGNAL (i.e., '0' for Multiplexers 231 and 237; Output signal from the previous Multiplexer for Multiplexers 232–236 and 238–240) |
| 1 | 0 | THIRD INPUT SIGNAL (i.e., '0') |
| 1 | 1 | N/A |

The previously described portion of FPGA 300A operates as follows to enable partial reconfiguration. First, a predetermined rectangular group of CLBs is selected for reconfiguration. The following example will assume that the rectangular group of CLBs which includes CLBs 14 and 15 is selected for reconfiguration. The other CLBs 1–13 and 16–24 are not to be reconfigured in this example.

After the rectangular group has been selected, reconfiguration control circuit 304 asserts a CLEAR signal on the CLEAR input terminals of flip flops 141–150, thereby clearing flip-flops 141–150. (The connections between reconfiguration control circuit 304 and the CLEAR input terminals of flip-flops 141–150 are not shown in FIG. 3A for purposes of clarity). The reconfiguration control circuit 304 then asserts a first COL_ADDRESS signal which is provided to address decoders 151–156. The first COL_ADDRESS signal is selected to correspond with the address decoder associated with the first column of the rectangular group of CLBs. Thus, in the present example, the first COL_ADDRESS signal is selected to correspond with address decoder 152. Upon receiving the first COL_ADDRESS signal, address decoder 152 asserts a logic '1' signal. At this time, the reconfiguration control circuit 304 asserts the COL_LOAD signal, thereby causing this logic '1' signal to be loaded into flip flop 142 and provided at the Q output terminal of flip flop 142.

The reconfiguration control circuit 304 then de-asserts the COL_LOAD signal and asserts a second COL_ADDRESS signal. The second COL_ADDRESS signal is selected to correspond with the address decoder associated with the column immediately after the last column of the determined rectangular group of CLBs. Thus, in the present example, the second COL_ADDRESS signal is selected to correspond with address decoder 154. Upon receiving the second COL_ADDRESS signal, address decoder 154 asserts a logic '1' signal. The second COL_ADDRESS signal remains asserted for the duration of the partial reconfiguration.

As a result, multiplexer 231 receives logic '0' signals on both control terminals, thereby causing multiplexer 231 to pass a logic '0' signal to column select line 61.

Multiplexer 232 receives a logic '0' signal on the first control terminal and a logic '1' signal on the second control terminal (from the Q output terminal of flip flop 142), thereby causing multiplexer 232 to pass a logic '1' signal to column select line 62.

Multiplexer 233 receives logic '0' signals on both control terminals, thereby causing multiplexer 233 to pass the logic '1' signal from the output terminal of multiplexer 232 to column select line 63.

Multiplexer 234 receives a logic '1' signal on the first control terminal (from address decoder 154) and a logic '0' signal on the second control terminal, thereby causing multiplexer 233 to pass a logic '0' signal to column select line 64.

Multiplexers 235 and 236 each receive logic '0' signals on both control terminals, thereby causing multiplexers 235 and 236 to pass the logic '0' signal from the output terminal of multiplexer 234 to column select lines 65 and 66.

Row select circuit 303A is operated substantially in parallel with the column select circuit 302A as follows. The reconfiguration control circuit 304 asserts a first ROW_ADDRESS signal which is provided to address decoders 157–160. The first ROW_ADDRESS signal is selected to correspond with the address decoder associated with the first row of the rectangular group of CLBs. Thus, in the present example, the first ROW_ADDRESS signal is selected to correspond with address decoder 159. Upon receiving the first ROW_ADDRESS signal, address decoder 159 asserts a logic '1' signal. At this time, the reconfiguration control circuit 304 asserts the ROW_LOAD signal, thereby causing this logic '1' signal to be loaded into flip flop 149 and provided at the Q output terminal of flip flop 149.

The reconfiguration control circuit 304 then de-asserts the ROW_LOAD signal and asserts a second ROW_ADDRESS signal. The second ROW_ADDRESS signal is selected to correspond with the address decoder associated with the row immediately after the last row of the determined rectangular group of CLBs. Thus, in the present example, the second ROW_ADDRESS signal is selected to correspond with address decoder 160. Upon receiving the second ROW_ADDRESS signal, address decoder 160 asserts a logic '1' signal. The second ROW_ADDRESS signal remains asserted for the duration of the partial reconfiguration.

As a result, multiplexer 237 receives logic '0' signals on both control terminals, thereby causing multiplexer 237 to pass a logic '0' signal to row select line 67.

Multiplexer 238 receives logic '0' signals on both control terminals, thereby causing multiplexer 238 to pass the logic '0' signal from the output terminal of multiplexer 237.

Multiplexer 239 receives a logic '0' signal on the first control terminal and a logic '1' signal on the second control terminal (from the Q output terminal of flip flop 149), thereby causing multiplexer 239 to pass a logic '1' signal to row select line 69.

Multiplexer 240 receives a logic '1' signal on the first control terminal (from address decoder 160) and a logic '0' signal on the second control terminal, thereby causing multiplexer 240 to pass a logic '0' signal to row select line 70.

As a result of the logic '1' signals asserted on column select lines 62 and 63 and row select line 69, the AND gates 14A and 15A of CLBs 14 and 15 provide logic '1' signals to the reconfiguration circuits 14B and 15B within CLBs 14 and 15, thereby enabling these reconfiguration circuits.

In the foregoing manner, any rectangular set of CLBs in an N×M array can be partially reconfigured by setting four address values.

Figure 3B:
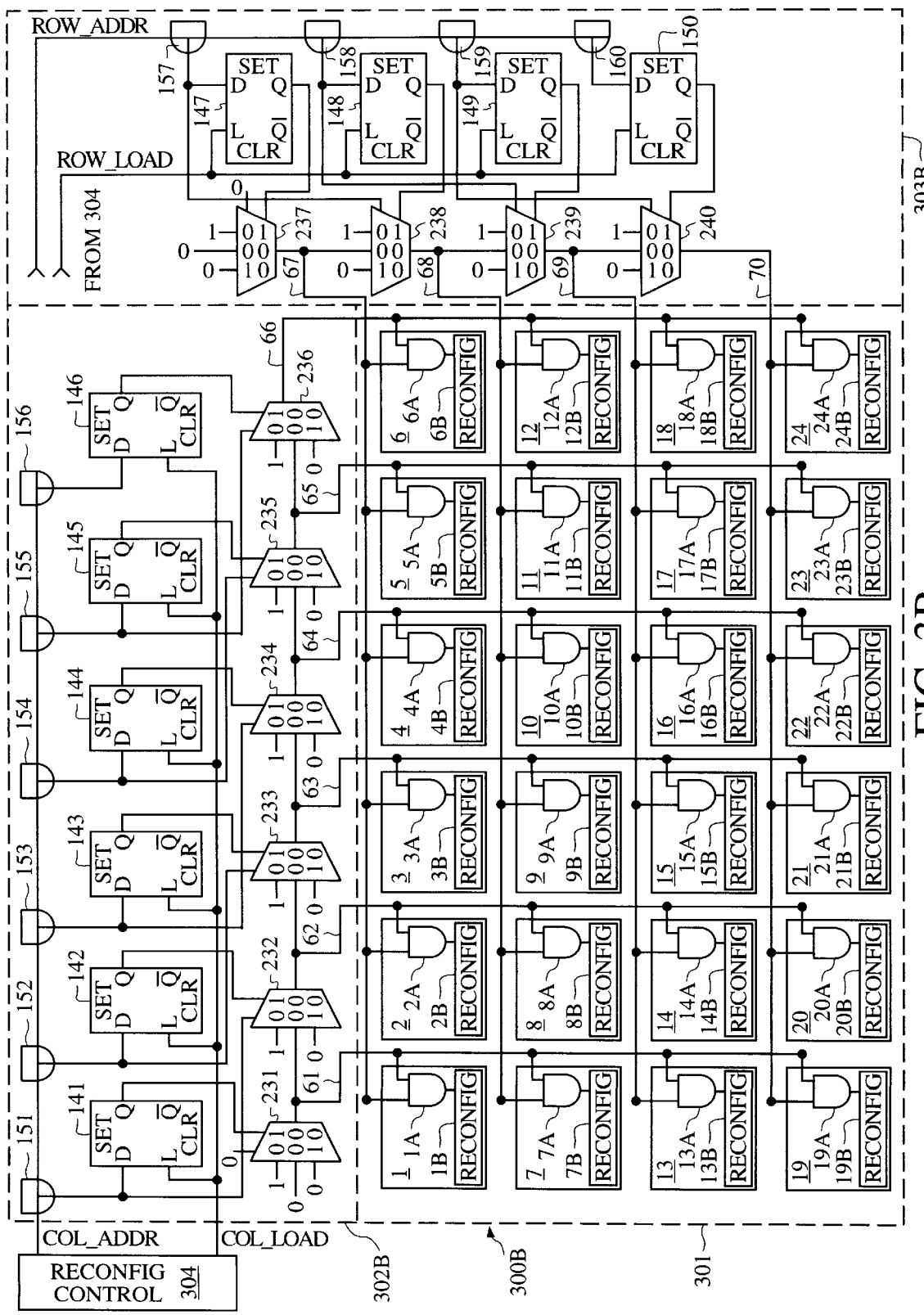
FIG. 3B is a schematic diagram of a portion of an FPGA in accordance with another variation of the present invention.

FIG. 3B is a schematic diagram of a portion of an FPGA 300B in accordance with one variation of the present invention. Many of the elements of FPGA 300B are similar to the previously described elements of FPGA 300A (FIG. 3A). Thus, similar elements in FIGS. 3A and 3B are labeled with similar reference numbers. The main difference between FPGA 300A and FPGA 300B are the connections between address decoder circuits 151–160 and the control terminals of multiplexers 231–240. Within column select circuit 302B of FPGA 300B, the first control terminal of multiplexer 231 is coupled to receive a logic 0 value and the first control terminals of multiplexers 232, 233, 234, 235 and 236 are connected to the output terminals of address decoders 151, 152, 153, 154 and 155, respectively. Thus, each of the address decoders 151–155 is connected to the first control terminal of the multiplexer immediately right of (or below) the multiplexer to which the address decoder was connected in FPGA 300A.

Similarly, within row select circuit 303B of FPGA 300B, the first control terminal of multiplexer 237 is coupled to receive a logic 0 value and the first control terminals of multiplexers 238, 239 and 240 are connected to the output terminals of address decoders 157, 158 and 159, respectively. Thus, each of the address decoders 157–159 is connected to the first control terminal of the multiplexer immediately right of (or below) the multiplexer to which the address decoder was connected in FPGA 300A.

FPGA 300B operates in a manner similar to that previously described for FPGA 300A. However, in FPGA 300B, the second COL_ADDRESS signal is selected to correspond with the last column of the rectangular block of CLBs to be reconfigured (rather than the column immediately after the last column). Similarly, in FPGA 300B, the second ROW_ADDRESS signal is selected to correspond with the last row of the rectangular block of CLBs to be reconfigured (rather than the row immediately after the last row).

Figure 3C:
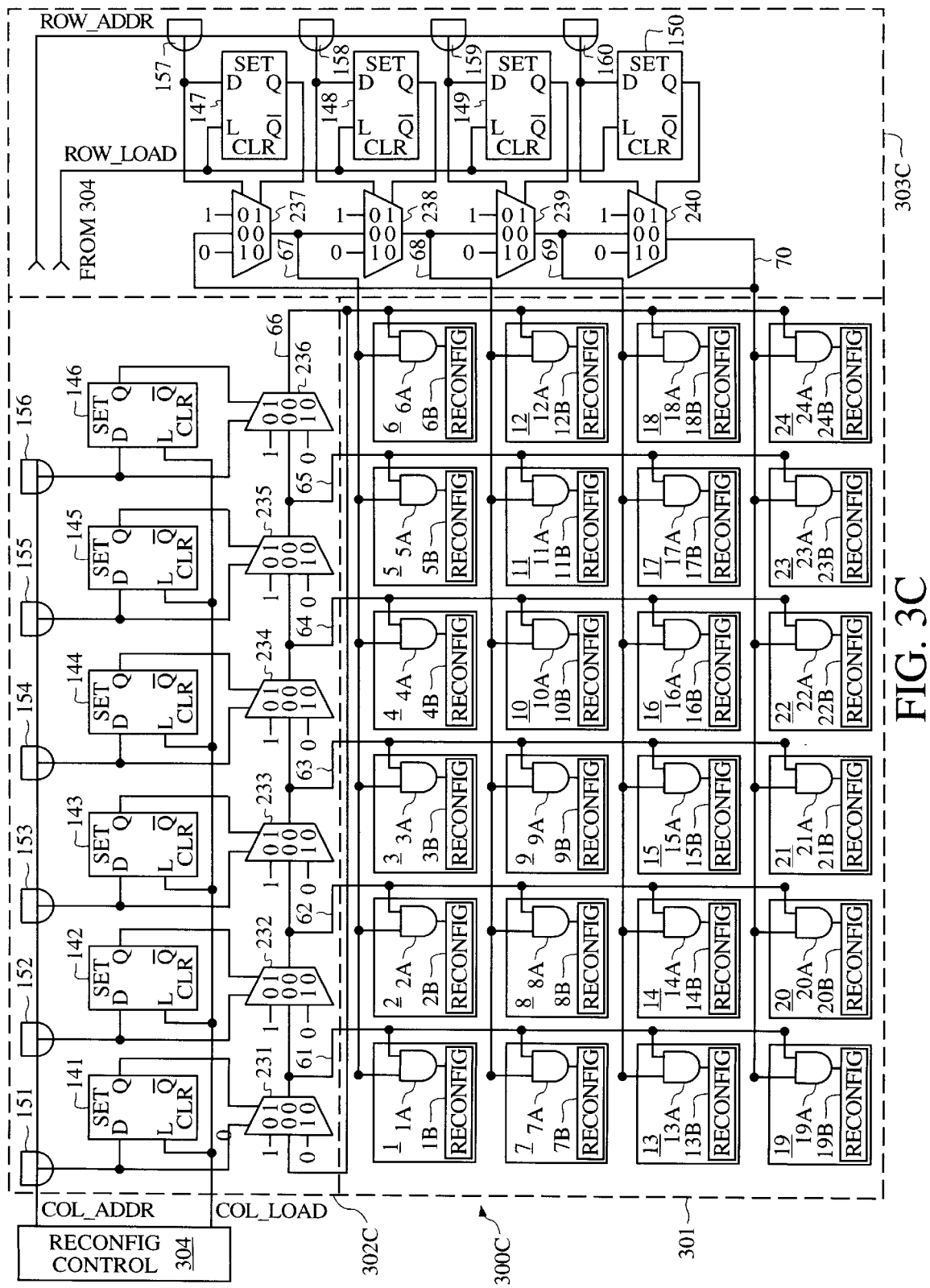
FIG. 3C is a schematic diagram of a portion of an FPGA in accordance with yet another variation of the present invention.

FIG. 3C is a schematic diagram of a portion of an FPGA 300C in accordance with another variation of the present invention. Many of the elements of FPGA 300C are similar to the previously described elements of FPGA 300A (FIG. 3A). Thus, similar elements in FIGS. 3A and 3C are labeled with similar reference numbers. The main difference between FPGA 300A and FPGA 300C is that the output terminal of multiplexer 236 is fed back into the second input terminal of multiplexer 231 within column select circuit 302C, and that the output terminal of multiplexer 240 is fed back into the second input terminal of multiplexer 237 within row select circuit 303C. FPGA 300C can be operated in the manner previously described for FPGA 300A to define a rectangular group of CLBs for reconfiguration. In addition, FPGA 300C can be operated as follows to define either two or four rectangular blocks of CLBs to be reconfigured.

For example, FPGA 300C can be controlled such that two rectangular blocks of CLBs can be reconfigured. In a first example, these two rectangular blocks are defined as a first rectangular block consisting of CLBs 1, 7, 13 and 19, and a second rectangular block consisting of CLBs 5, 6, 11, 12, 17, 18, 23 and 24.

To define such first and second rectangular blocks for reconfiguration, reconfiguration control circuit 304 initially generates a first COL_ADDRESS signal which corresponds with address decoder 155. Reconfiguration control circuit 304 then asserts the COL_LOAD signal, thereby latching a logic '1' value in flip flop 145. The logic '1' value provided at the Q output terminal of flip flop 145 causes a logic '1' value to be routed through multiplexer 235 to column select line 65 and to multiplexer 236.

Reconfiguration control circuit 304 then generates a second COL_ADDRESS signal which corresponds with address decoder 152. In response, address decoder 152 provides a logic '1' value to the first control terminal of multiplexer 232, thereby causing multiplexer 232 to route a logic '0' signal to column select line 62 and to multiplexer 233.

In this example, the logic '1' value provided by multiplexer 235 is routed through multiplexer 236 to column select line 66. This logic '1' value is further fed back into multiplexer 231. The logic '1' value is further routed through multiplexer 231 to column select line 61. The propagation of the logic 1 value is stopped at multiplexer 232, which routes a logic '0' value in response to the second COL_ADDRESS signal as previously described. This logic '0' value is then propagated through multiplexers 233 and 234, such that logic 0 values are provided to column select lines 63 and 64.

The logic '1' value routed to column select line 61 defines a first stripe of columns which includes CLBs 1, 7, 13 and 19. Similarly, the logic '1' values routed to column select lines 65 and 66 defines a second stripe of columns which includes CLBs 5, 6, 11, 12, 17, 18, 23 and 24.

In the present example, reconfiguration control circuit 304 further generates a first ROW_ADDRESS signal which corresponds with address decoder 157. Reconfiguration control circuit 304 then asserts a ROW_LOAD signal, thereby latching a logic '1' value in flip flop 147. The logic '1' value provided at the Q output terminal of flip flop 147 causes a logic '1' value to be routed through multiplexer 237 to row select line 67 and to multiplexer 236. Reconfiguration control circuit 304 then asserts an invalid second ROW_ADDRESS signal (i.e., a ROW_ADDRESS signal which does not address any of address decoders 157–160). As a result, the logic '1' value is propagated through multiplexers 238, 239 and 240 to each of row select lines 68, 69 and 70. The logic '1' values routed to row select lines 67–70 define a single broad stripe of rows which includes all of the CLBs 1–24. A similar result is obtained by providing any valid first ROW_ADDRESS signal followed by an invalid second ROW_ADDRESS signal. As a result, CLBs 1, 7, 13, and 19 (i.e., a first rectangular group of CLBs) and CLBs 5, 6, 11, 12, 17, 18, 23 and 24 (i.e., a second rectangular group of CLBs) are selected for reconfiguration. In a particular implementation, the last column of CLBs is selected by providing a first COL_ADDRESS signal which corresponds with address decoder 156 and a second COL_ADDRESS signal which corresponds with address decoder 151.

In a variation of this embodiment, row select circuit 303C can be controlled to select two stripes of rows in the same manner that column select circuit 302C was controlled to select two column stripes. In this variation, four rectangular groups of CLBs are selected for reconfiguration, as defined by the intersection of the two stripes of rows and two stripes of columns. In yet another variation, row select circuit 303C is controlled to select two stripes of rows, and column select circuit 302C is controlled to select one broad stripe of columns. In this variation, two rectangular groups of CLBs are selected for reconfiguration, as defined by the intersection of the two stripes of rows and the single stripe of columns.

In an alternative embodiment, the feed back configuration of FPGA 300C can also be applied to FPGA 300B. That is, the output terminal of multiplexer 236 can be fed back into the second input terminal of multiplexer 231 in column select circuit 302B, and the output terminal of multiplexer 240 can be fed back into the second input terminal of multiplexer 237 in row select circuit 303B. This alternative enables FPGA 300B to be reconfigured in rectangular groups of two or four.

Figure 4:
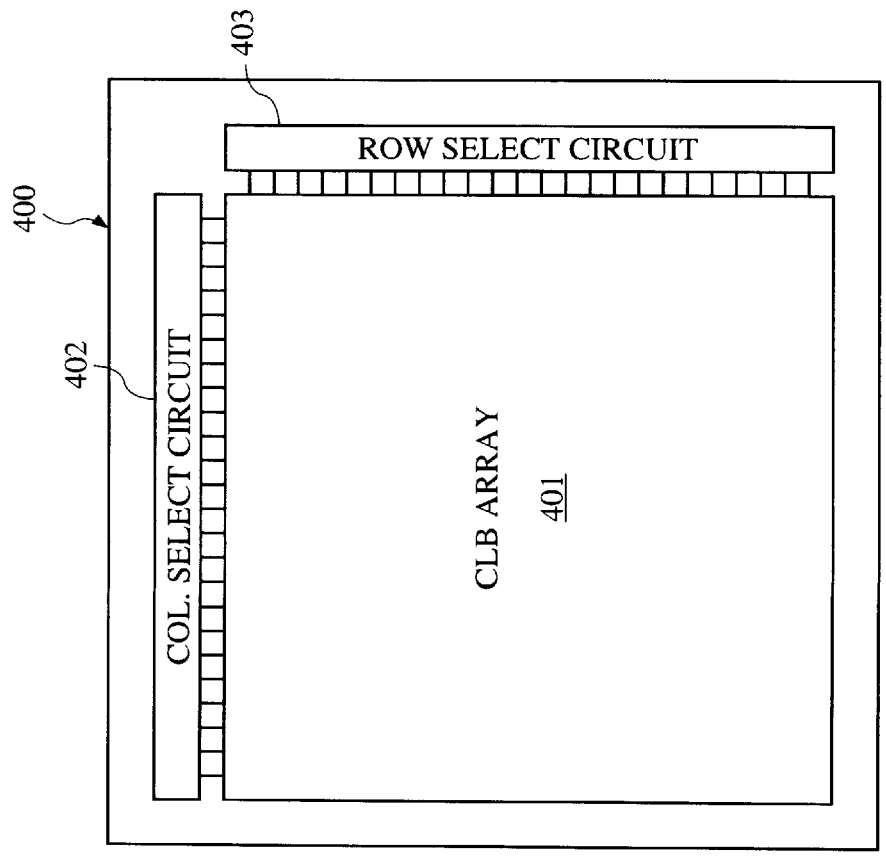
FIG. 4 is a schematic diagram which illustrates the layout of an FPGA in accordance with one embodiment of the present invention.

FIG. 4 is a schematic diagram which illustrates the layout of an FPGA 400 in accordance with one embodiment of the present invention. In this embodiment, a CLB array 401 is located near a central location of the FPGA chip. The associated column select circuit 402 is located along one edge of the chip. The associated row select circuit 403 is located along an adjacent edge of the chip. Thus, the column select circuit 402 and the row select circuit 403 are located at the perimeter of the FPGA chip.

Figure 5:
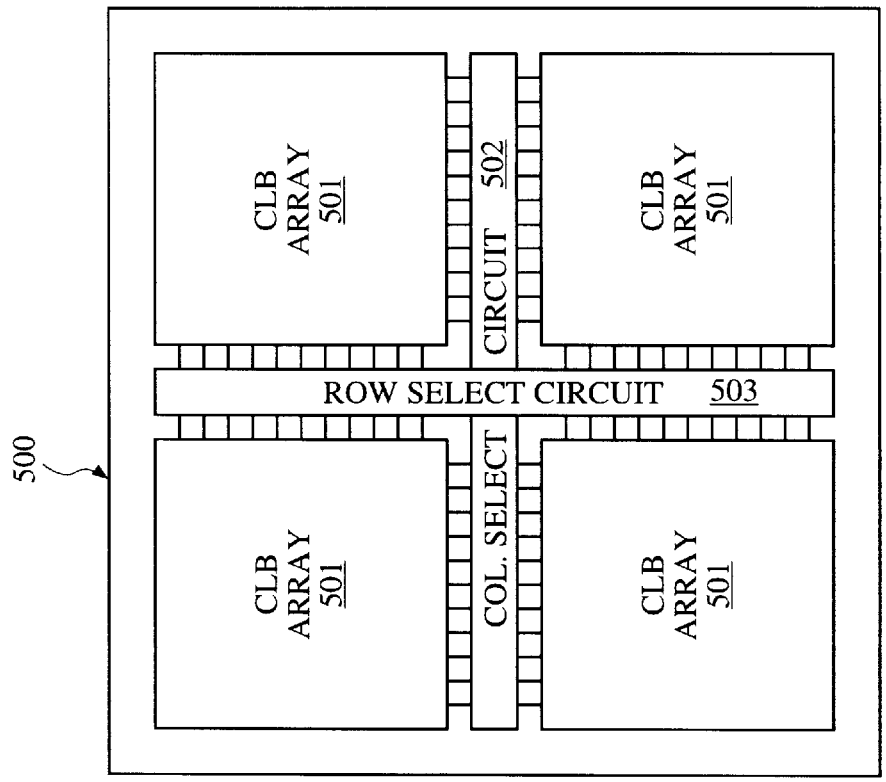
FIG. 5 is a schematic diagram which illustrates the layout of an FPGA in accordance with another embodiment of the present invention.

FIG. 5 is a schematic diagram which illustrates the layout of an FPGA 500 in accordance with another embodiment of the present invention. In this embodiment, a CLB array 501 is located near a central location of the FPGA chip. The associated column select circuit 502 extends along a first axis through a centrally located region of CLB array 501. The associated row select circuit 503 extends along a second axis, which is perpendicular to the first axis, through a centrally located region of CLB array 501.

Although the invention has been described in connection with several embodiments, it is understood that this invention is not limited to the embodiments disclosed, but is capable of various modifications which would be apparent to a person skilled in the art. For example, although the present invention has been described using particular logic gates, it is understood that similar results can be achieved by modifying the logic gates used in the circuit design. For example, AND gates 1A–24A can be replaced with NAND gates, thereby providing a circuit which prohibits the reconfiguration of selected CLBs. Thus, the invention is limited only by the following claims.

What is claimed is:

1. A method for partially reconfiguring an array of configurable logic blocks (CLBs) arranged in a plurality of rows and columns, the method comprising the steps of:

connecting each column of CLBs to a corresponding column select line;

connecting each row of CLBs to a corresponding row select line;

selecting a rectangular set of CLBs to be reconfigured, wherein the rectangular set of CLBs is defined by the intersection of one or more consecutive columns of CLBs and one or more consecutive rows of CLBs;

asserting column select signals on the column select lines associated with the one or more consecutive columns of CLBs;

asserting row select signals on the row select lines associated with the one or more consecutive rows of CLBs; and enabling reconfiguration circuits within each CLB which receives both an asserted column select signal and an asserted row select signal;

wherein the step of asserting the column select signals further comprises the steps of:

asserting a first column select signal on a first column select line;

propagating the first column select signal to one or more consecutive column select lines; and generating a control signal for stopping the propagation of the first column select signal.

2. The method of claim 1, wherein the step of asserting the row select signals further comprises the steps of:

asserting a first row select signal on a first row select line;

propagating the first row select signal to one or more consecutive row select lines; and generating a control signal for stopping the propagation of the first row select signal.

3. A method of reconfiguring a field programmable gate array having an array of configurable logic blocks (CLBs), the method comprising the steps of:

selecting a block of CLBs within the array of CLBs for reconfiguration, the block of CLBs being defined by one or more consecutive rows beginning with a first row and ending with a second row, and one or more consecutive columns beginning with a first column and ending with a second column;

addressing the first row to generate a row select signal which is asserted at the first row and propagates toward the second row;

addressing the first column to generate a column select signal which is asserted at the first column and propagates toward the second column;

addressing the row immediately following the second row, thereby stopping the propagation of the row select signal at the second row;

addressing the column immediately following the second column, thereby stopping the propagation of the column select signal at the second column; and reconfiguring each CLB which receives both the column select signal and the row select signal.

4. A field programmable gate array (FPGA) comprising:

an array of configurable logic blocks (CLBs) arranged in a plurality of rows and columns, wherein each of the CLBs includes a reconfiguration circuit for reconfiguring the CLB, and an enabling circuit for enabling the reconfiguration circuit;

a plurality of column select lines, wherein each of the column select lines is coupled to each of the enabling circuits in a corresponding column of the CLBs;

a plurality of row select lines, wherein each of the row select lines is coupled to each of the enabling circuits in a corresponding row of the CLBs;

a column select circuit coupled to each of the column select lines, wherein the column select circuit comprises a plurality of cascaded exclusive OR gates, wherein each of the exclusive OR gates has an output terminal which is coupled to a corresponding column select line, wherein the column select circuit is controlled to assert column select signals on one or more consecutive column select lines; and a row select circuit coupled to each of the row select lines, wherein the row select circuit is controlled to assert row select signals on one or more consecutive row select lines, wherein the enabling circuits that receive both a column select signal and a row select signal enable the associated reconfiguration circuits.

5. The FPGA of claim 4, wherein the column select circuit further comprises:

a plurality of flip flops, wherein each flip flop has an input terminal coupled to receive a logic signal having a first state, and an output terminal coupled to an input terminal of a corresponding one of the exclusive OR gates; and a plurality of address decoders each having a unique associated address, each of the address decoders having an output terminal coupled to a load input terminal of a corresponding one of the flip flops, and each of the address decoders having input terminals coupled to receive an address signal.

6. The FPGA of claim 5, wherein the exclusive OR gate coupled to the column select line associated with the first column of CLBs has an input terminal coupled to receive a logic signal having a second state.

7. The FPGA of claim 5, wherein the row select circuit further comprises:

a plurality of flip flops, wherein each flip flop has an input terminal coupled to receive a logic signal having the first state, and an output terminal coupled to an input terminal of a corresponding one of the exclusive OR gates of the row select circuit; and a plurality of address decoders, each having a unique associated address, each of the address decoders having an output terminal coupled to a load input terminal of a corresponding one of the flip flops of the row select circuit, and each of the address decoders having input terminals coupled to receive an address signal.

8. The FPGA of claim 4, wherein the row select circuit comprises a plurality of cascaded exclusive OR gates, wherein each of the exclusive OR gates of the row select circuit has an output terminal which is coupled to a corresponding row select line.

9. The FPGA circuit of claim 4, wherein the column select circuit further comprises:
   a plurality of OR gates, wherein each of the OR gates has an output terminal coupled to an input terminal of a corresponding one of the exclusive OR gates;
   a plurality of flip flops, wherein each of the flip flops has an output terminal coupled to an input terminal of a corresponding one of the OR gates, and a load enable terminal coupled to receive a load enable signal; and
   a plurality of address decoders, each having a unique associated address, each of the address decoders having an output terminal coupled to a load input terminal of an input terminal of a corresponding one of the flip flops and to an input terminal of a corresponding one of the OR gates.

10. The FPGA of claim 9, wherein the exclusive OR gate coupled to the column select line associated with an initial column of CLBs has an input terminal coupled to receive a logic signal having a predetermined state.

11. The FPGA of claim 9, wherein the row select circuit comprises:
   a plurality of cascaded exclusive OR gates, wherein each of the exclusive OR gates of the row select circuit has an output terminal which is coupled to a corresponding row select line;
   a plurality of OR gates, wherein each of the OR gates has an output terminal coupled to an input terminal of a corresponding one of the exclusive OR gates of the row select circuit;
   a plurality of flip flops, wherein each of the flip flops has an output terminal coupled to an input terminal of a corresponding one of the OR gates of the row select circuit, and a load enable terminal coupled to receive a load enable signal; and
   a plurality of address decoders, each having a unique associated address, each of the address decoders having an output terminal coupled to a load input terminal of an input terminal of a corresponding one of the flip flops of the row select circuit and to an input terminal of a corresponding one of the OR gates of the row select circuit.

12. The FPGA of claim 11, wherein the exclusive OR gate coupled to the row select line associated with an initial row of CLBs has an input terminal coupled to receive a logic signal having a predetermined state.

13. A field programmable gate array (FPGA) comprising:
   an array of configurable logic blocks (CLBs) arranged in a plurality of rows and columns, wherein each of the CLBs includes a reconfiguration circuit for reconfiguring the CLB, and an enabling circuit for enabling the reconfiguration circuit;
   a plurality of column select lines, wherein each of the column select lines is coupled to each of the enabling circuits in a corresponding column of the CLBs;
   a plurality of row select lines, wherein each of the row select lines is coupled to each of the enabling circuits in a corresponding row of the CLBs;
   a column select circuit coupled to each of the column select lines, wherein the column select circuit comprises a plurality of cascaded multiplexers, wherein each of the multiplexers has an output terminal which is coupled to a corresponding column select line, wherein the column select circuit is controlled to assert column select signals on one or more consecutive column select lines; and
   a row select circuit coupled to each of the row select lines, wherein the row select circuit is controlled to assert row select signals on one or more consecutive row select lines, wherein the enabling circuits that receive both a column select signal and a row select signal enable the associated reconfiguration circuits.

14. The FPGA of claim 13, wherein the row select circuit comprises a plurality of cascaded multiplexers, wherein each of the multiplexers of the row select circuit has an output terminal which is coupled to a corresponding row select line.

15. The FPGA of claim 13, wherein the column select circuit further comprises:
   a plurality of flip flops, each flip flop having an output terminal coupled to a first control terminal of a corresponding one of the multiplexers, each flip flop further having a load enable terminal coupled to receive a load enable signal; and
   a plurality of address decoders, each having a unique address and being coupled to receive an address signal, wherein each of the address decoders has an output terminal coupled to in input terminal of a corresponding one of the flip flops and to a second control terminal of a corresponding one of the multiplexers.

16. The FPGA of claim 15, wherein each of the multiplexers further comprises a first input terminal coupled to receive a input signal having a first logic state and a second input terminal coupled to receive an input signal having a second logic state.

17. The FPGA of claim 16, wherein a multiplexer associated with a first column of the array of CLBs is further coupled to receive an input signal having the second logic state.

18. A field programmable gate array (FPGA) comprising:
   an array of configurable logic blocks (CLBs) arranged in a plurality of rows and columns, wherein each of the CLBs includes a reconfiguration circuit for reconfiguring the CLB, and an enabling circuit for enabling the reconfiguration circuit;
   a plurality of column select lines, wherein each of the column select lines is coupled to each of the enabling circuits in a corresponding column of the CLBs;
   a plurality of row select lines, wherein each of the row select lines is coupled to each of the enabling circuits in a corresponding row of the CLBs;
   a column select circuit comprising a first plurality of logic gates having binary outputs, each of the logic gates having an output terminal coupled to a corresponding column select line, wherein the column select circuit is controlled to assert column select signals on one or more consecutive column select lines; and a row select circuit comprising a second plurality of logic gates having binary outputs, each of the logic gates having an output terminal coupled to a corresponding row select line, wherein the row select circuit is controlled to assert row select signals on one or more consecutive row select lines, wherein the enabling circuits that receive both a column select signal and a row select signal enable the associated reconfiguration circuits, and wherein the first plurality of logic gates comprises a plurality of cascaded exclusive OR gates.

19. The FPGA of claim 18, wherein the second plurality of logic gates comprises a plurality of cascaded exclusive OR gates.

* * * * *